United States Patent
Yang

(10) Patent No.: US 7,259,468 B2
(45) Date of Patent: Aug. 21, 2007

(54) STRUCTURE OF PACKAGE

(75) Inventor: Wen-Kun Yang, Hsinchu (TW)

(73) Assignee: Advanced Chip Engineering Technology Inc., Hsinchu County (TW)

( * ) Notice: Subject to any disclaimer, the term of this patent is extended or adjusted under 35 U.S.C. 154(b) by 0 days.

(21) Appl. No.: 10/835,571

(22) Filed: Apr. 30, 2004

(65) Prior Publication Data

US 2005/0242418 A1 Nov. 3, 2005

(51) Int. Cl.
*H01L 23/52* (2006.01)
*H01L 23/48* (2006.01)
*H01L 29/40* (2006.01)

(52) U.S. Cl. ............... 257/786; 257/781; 257/738; 257/778; 257/E23.02

(58) Field of Classification Search ......... 257/678, 257/737, 738, 759, 758, E23.02, 778, 762, 257/765, 766, 771, 772, 776, 786, 781, E23.019
See application file for complete search history.

(56) References Cited

U.S. PATENT DOCUMENTS

| | | | | |
|---|---|---|---|---|
| 5,394,013 A | * | 2/1995 | Oku et al. ............ | 257/786 |
| 5,712,506 A | * | 1/1998 | Shimoto et al. ........ | 257/633 |
| 5,925,934 A | * | 7/1999 | Lim ................... | 257/778 |
| 6,103,552 A | * | 8/2000 | Lin .................... | 438/113 |
| 6,187,615 B1 | * | 2/2001 | Kim et al. ............ | 438/113 |
| 6,400,034 B1 | * | 6/2002 | Kimura et al. ......... | 257/778 |
| 6,445,001 B2 | * | 9/2002 | Yoshida .............. | 257/48 |
| 6,448,660 B2 | * | 9/2002 | Shibata .............. | 257/777 |
| 6,521,970 B1 | * | 2/2003 | Takiar et al. ......... | 257/522 |
| 6,528,349 B1 | * | 3/2003 | Patel et al. ........... | 438/117 |
| 6,538,326 B2 | * | 3/2003 | Shimizu et al. ....... | 257/758 |
| 6,614,049 B1 | * | 9/2003 | Koyama .............. | 257/48 |
| 6,624,504 B1 | * | 9/2003 | Inoue et al. .......... | 257/668 |
| 6,656,827 B1 | * | 12/2003 | Tsao et al. ........... | 438/612 |
| 6,717,243 B2 | * | 4/2004 | Shinogi et al. ........ | 257/673 |
| 6,756,671 B2 | * | 6/2004 | Lee et al. ............ | 257/737 |
| 6,780,748 B2 | * | 8/2004 | Yamaguchi et al. .... | 438/612 |
| 6,806,570 B1 | * | 10/2004 | Lee et al. ............ | 257/737 |

FOREIGN PATENT DOCUMENTS

JP        05251573 A  *  9/1993

* cited by examiner

*Primary Examiner*—Kenneth Parker
*Assistant Examiner*—Chris C. Chu
(74) *Attorney, Agent, or Firm*—Kusner & Jaffe

(57) ABSTRACT

The present invention discloses a structure of wafer level packaging. The structure comprises a first patterned isolation layer, a conductive layer and a second patterned isolation layer. The first patterned isolation layer is formed with a passivation layer of an IC (Integrated Circuit). The conductive layer is configured to have a curved or winding conductive pattern. The second patterned isolation layer is formed over the conductive layer to have a plurality of openings, and contact metal balls can be formed on the openings to electrically couple to a print circuit board.

9 Claims, 2 Drawing Sheets

STRUCTURE OF PACKAGE

BACKGROUND OF THE INVENTION

1. Field of the Invention

This invention relates to a wafer level package, and more particularly to a wafer level package structure, the wafer level package structure can avoid the open circuit caused by the solder ball cracking due to the temperature variation inducing the reinforcing stress between the solder balls and a print circuit board.

2. Description of the Prior Art

The earlier lead frame package technology is already not suitable for the advanced semiconductor dies due to the density of the terminals thereof is too high. Hence, a new package technology of BGA (Ball Grid Array) has been developed to satisfy the packaging requirement for the advanced semiconductor dies. The BGA package has an advantage of that the spherical terminals has a shorter pitch than that of the lead frame package, and the terminals of the BGA are unlikely to be damage and deform. In addition, the shorter signal transmitting distance benefits to raise the operating frequency to conform to the requirement of faster efficiency. Most of the package technologies divide dice on a wafer into respective dies and then to package and test the die respectively. Another package technology, called "Wafer Level Package (WLP)", can package the dies on a wafer before dividing the dice into respective individual die. The WLP technology has some advantages, such as a shorter producing cycle time, lower cost, and no need to under-fill or molding.

Besides, a partial package structure using in the present marketing is shown as FIG. 1. The package structure comprises an isolation layer 103 and a passivation layer 102 of an IC device 100. The material of the isolation layer 103 may be a dielectric layer with a thickness of 5 micron such as BCB, polyimides etc. The material of the passivation layer 102 is polyimides or SiN. The redistribution layer (RDL) 104 is combined with the isolation layer 103, Al pads 101 of the IC device. The material of the redistribution layer (RDL) 104 may be Cu/Ni/Au alloy with a thickness of 15 micron. Moreover, an isolation layer 105 covers the redistribution layer (RDL) 104. And, the redistribution layer (RDL) 104 has a plurality of openings. Each of the openings has a solder ball 106 to electrically couple with a print circuit board or external parts. The material of the isolation layer 105 may be a dielectric layer such as BCB, epoxy, or polyimides etc.

The aforementioned package structure generally needs an additional material to intensively fix the solder ball 106. It has a drawback mentioned as follows: the adhesion between the redistribution layer (RDL) 104 and the isolation layer 105 is too strong, which is a drawback to the solder ball. When the solder ball 106 joints to the print circuit board, the stress may be induced by temperature influence at the joint part between the solder ball 106 and the redistribution layer (RDL) 104, it is indicated by the area 107, the solder ball 106 will be cracked owing to reinforcing stress raised by temperature variation, thereby causing an open circuit between the solder ball and pad.

In view of the aforementioned, the present invention provides an improved wafer level package structure to overcome the above drawback.

SUMMARY OF THE INVENTION

It is an objective of the present invention to provide a wafer level package structure. The wafer level package structure of the present invention can avoid open circuit due to solder ball cracking by reinforcing stress.

The present invention provides a wafer level package structure. The package structure comprises a first patterning isolation layer, a conductive layer and a second patterned isolation layer. The first patterned isolation layer is provided adjacent to a passivation layer of an IC (Integrated Circuit). The conductive layer is configured over the passivation layer and metal pads of the IC to have a curved or winding or zigzag conductive pattern. The second patterned isolation layer is formed over the conductive layer having a plurality of openings, and contact metal balls can be formed in the openings to electrically couple to a print circuit board.

The conductive layer will not directly stretch the metal pads when the contact metal ball joints to a print circuit board. The zigzag conductive layer creates buffer area, like a cushion to absorb the stress by poor adhesion between the curved or zigzag conductive layer pattern and the patterned first isolation layer.

BRIEF DESCRIPTION OF THE DRAWINGS

The above objects, and other features and advantages of the present invention will become more apparent after reading the following detailed description when taken in conjunction with the drawings, in which.

DESCRIPTION OF THE PREFERRED EMBODIMENT

The present invention provides a backend structure of wafer level packaging, and the scope of the present invention is expressly not limited expect as specified in the accompanying claims. The present invention discloses a structure of package, comprising: a patterned isolation layer covering a partial region of a underlying layer; and a conductive layer configured on the patterned isolation layer to have a zigzag pattern to absorb stress due to the topography of the patterned isolation layer. Wherein the material for the isolation layer comprises BCB, SINR (Siloxane polymer), epoxy, polyimides or resin. The material for the conductive layer is metal alloy.

Figure 1:
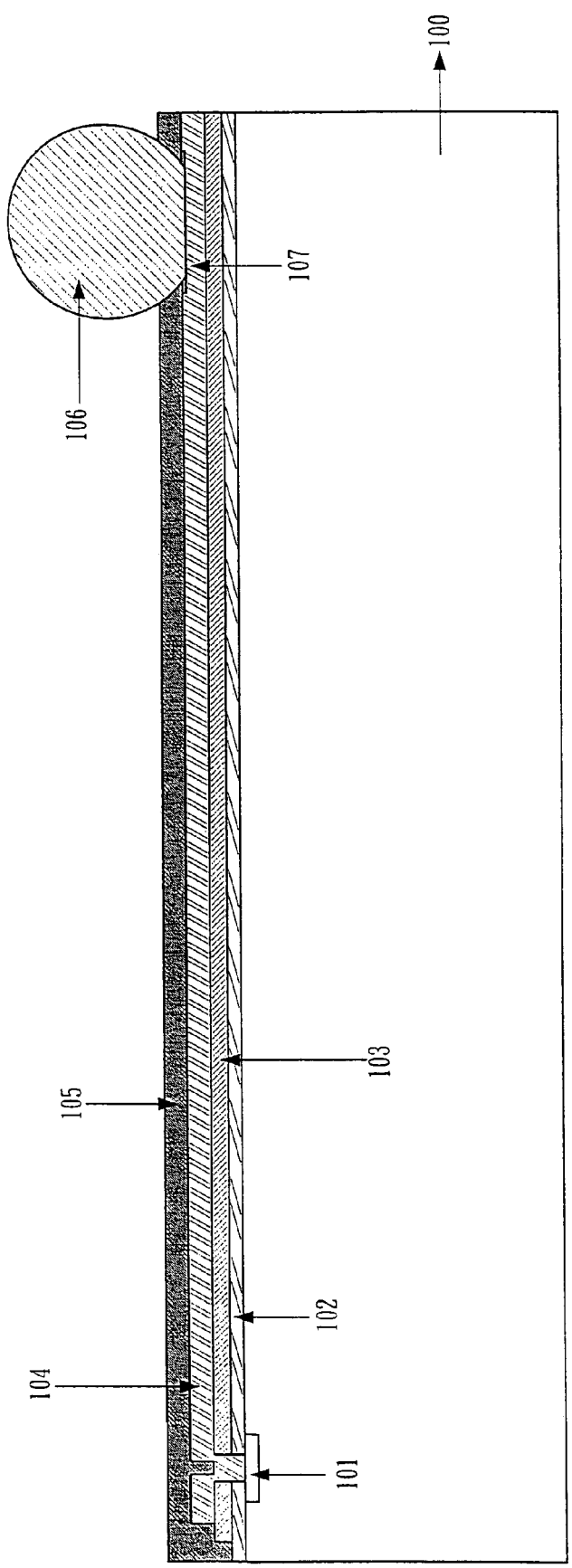
FIG. 1 is a schematic diagram of a conventional wafer level package structure.
Figure 2:
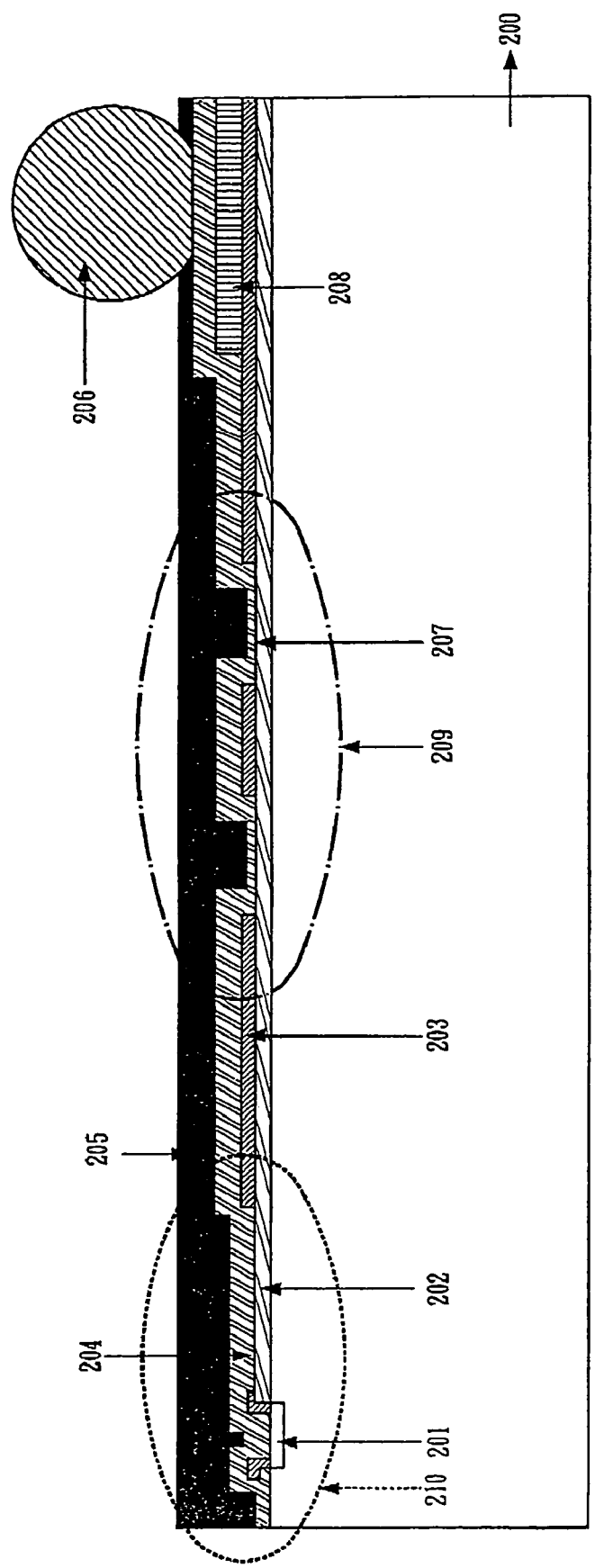
FIG. 2 is a schematic diagram of one wafer level package structure according to the present invention.

As shown in FIG. 2, it is a schematic diagram of one wafer level package structure according to the present invention. The wafer level packaging is expressly not limited expect as specified in the accompanying claims of the present invention. The present invention comprises a patterned isolation layer 203 covering a partial region of passivation layer 202 of a device 200. The material of the isolation layer 203 may be dielectric, such as BCB, SINR (Siloxane polymer), epoxy, polyimides or resin etc. The patterned isolation layer 203 has a plurality of openings to expose the underlying passivation layer 202. The material of the passivation layer 202 comprises polyimide or SiN. The area indicated by 207 will suffer the external force as shown in FIG. 2.

The redistribution layer (RDL) 204 on the patterned isolation layer 203 is configured with a zigzag or winding conductive layer pattern owing to the pattern topography of the isolation layer. In one preferred embodiment, the material of the conductive layer includes Ti/Cu alloy or Cu/Ni/Au alloy with a thickness of 15 micron. The Ti/Cu alloy may be formed by sputtering technique, the Cu/Ni/Au alloy may be formed by electroplating. The material of the metal pads 201 may be Al or Cu or the combination.

Furthermore, an isolation layer 205 is formed on the conductive layer 204 and the isolation layer 205 have a plurality of openings. Each of the openings has a contact metal ball 206 to electrically couple to a print circuit board (PCB) or external parts (not shown). The contact metal ball 206 may be a conductive ball such as solder ball 206. The material of the isolation layer 205 may be formed of dielectric such as BCB, SINR (Siloxane polymer), epoxy, polyimides or resin etc.

The conductive layer 204 adjacent to the fixed area 210 of the package structure will not directly stretch the metal pads 201 of inter-connector of the IC device 200 due to the passivation layer 202 tightly "catches" the conductive layer 204 by the scheme disclosed by the present invention. The temperature influence will be reduced owing to the conductive layer 204 directly joint to the passivation layer 202 when the solder ball 206 mounts to the print circuit board, it may induce thermal stress.

Besides, in the buffer area 209 of the package structure, the conductive layer 204 is partially attached to the passivation layer 202 and partially formed on the isolation layer 203 so that the conductive layer 204 is configured to have a curve or zigzag pattern. The stress generated by temperature variation will be distributed due to the shape of the conductive layer and the zigzag structure of the conductive layer acts as a cushion to release the thermal stress. The adhesion between the conductive layer 204 and the isolation layer 203 is poor, the conductive layer 204 will slightly peel from the surface of the isolation layer 203 when external force applied. The extension of the conductive layer will be increased owing to curved conductive layer pattern with zigzag scheme will slightly peel and absorbs the thermal stress. Therefore, the life time of the package structure will be increased. Especially, when the solder ball 206 is far away from the bonding pad.

The present invention also comprises a patterned isolation layer 208 formed between the isolation layer 203 and the conductive layer 204 to increase the zigzag level (namely, increase the number of the zigzag shape) of the conductive layer under the solder ball. The material of the isolation layer 208 comprises BCB, SINR (Siloxane polymer), epoxy, polyimides or resin. Hence, according to the present invention, the aforementioned package structure has the advantages listed as follows: the wafer level package structure of the present invention can avoid an open circuit of the solder ball cracking generated by reinforcing stress due to temperature variation after the solder balls are placed on the print circuit board. Moreover, it does not need an additional material to intensively fix the solder ball.

Although specific embodiments have been illustrated and described, it will be obvious to those skied in the art that various modifications may be made without departing from what is intended to be limited solely by the appended claims.

What is claimed is :

1. A structure of package, comprising:
   a device having a fixed area and a buffer area, wherein metal pads are formed over said fixed area and a zigzag cushion is formed over said buffer area;
   a patterned first isolation layer covering a partial region of a passivation layer of said device, wherein said zigzag cushion is formed on said patterned first isolation layer to have a zigzag pattern due to the topography of said patterned first isolation layer, wherein said zigzag pattern is partially attached on said passivation layer and partially attached on said patterned first isolation layer;
   a second isolation layer covering said zigzag cushion, said second isolation layer having a plurality of openings, each of said openings having a contact conductive ball electrically coupling with an external part; and
   a patterned third isolation layer formed between said patterned first isolation layer and said zigzag cushion;
   wherein the material for said third isolation layer is a material selected from the group consisting of BCB, SINR (Siloxane polymer), epoxy, polyimide and resin, wherein said zigzag cushion at said fixed area of said structure of package will not directly stretch said metal pads when said contact conductive ball is placed on a printed circuit board, said zigzag cushion acting as a buffer of said package to absorb the stress.

2. The structure in claim 1, wherein the material for said passivation layer is polyimide.

3. The structure in claim 1, wherein the material for said zigzag cushion is metal alloy.

4. The structure in claim 3, wherein said metal alloy is a material selected from the group consisting of Ti/Cu alloy and Cu/Ni/Au alloy, said Ti/Cu alloy being formed by sputtering and said Cu/Ni/Au alloy being formed by electroplating.

5. The structure in claim 3, wherein the thickness of said metal alloy is around 10~20 micron.

6. The structure in claim 1, wherein the material of said metal pads is a material selected from the group consisting of Al and Cu.

7. The structure in claim 1, wherein the material of said second isolation layer is a material selected from the group consisting of BCB, SINR (Siloxane polymer), epoxy, polyimide and resin.

8. The structure in claim 1, wherein said contact conductive ball is solder ball.

9. The structure in claim 1, wherein the material for said first isolation layer is a material selected from the group consisting of BCB, SINR (Siloxane polymer), epoxy, polyimide and resin.

* * * * *